United States Patent [19]

Fox

[11] Patent Number: 4,731,585
[45] Date of Patent: Mar. 15, 1988

[54] ANTENNA COUPLING CIRCUIT FOR MAGNETIC RESONANCE IMAGING

[75] Inventor: Timothy R. Fox, Chicago, Ill.

[73] Assignee: Kabushiki Kaisha Toshiba, Kawasaki, Japan

[21] Appl. No.: 18,161

[22] Filed: Feb. 24, 1987

[51] Int. Cl.[4] .............................................. G01R 33/20
[52] U.S. Cl. ................................... 324/322; 328/221; 307/559
[58] Field of Search .................... 361/15, 17; 324/300, 324/307, 318, 319, 320, 322, 126; 330/284, 306; 455/266; 336/69; 307/559; 328/221

[56] References Cited

U.S. PATENT DOCUMENTS

| | | | |
|---|---|---|---|
| 3,603,871 | 9/1971 | Caunter | 324/322 |
| 3,735,246 | 5/1973 | Glenat | 324/322 |
| 3,870,926 | 3/1975 | Hughes | 324/126 |
| 4,129,822 | 12/1978 | Traficante | 324/322 |
| 4,249,137 | 2/1981 | Malchow | 330/283 |
| 4,327,390 | 4/1982 | Despiney | 324/126 |
| 4,371,846 | 2/1983 | Gamble | 330/306 |
| 4,620,155 | 10/1986 | Edelstein | 324/322 |
| 4,628,264 | 12/1986 | Rzedzian | 324/322 |
| 4,633,181 | 12/1986 | Boesch | 324/322 |
| 4,649,348 | 3/1987 | Flugan | 324/322 |

Primary Examiner—Michael J. Tokar
Attorney, Agent, or Firm—Finnegan, Henderson, Farabow, Garrett & Dunner

[57] ABSTRACT

A coupling circuit for coupling an inductive coil antenna of a magnetic resonance imaging system to receiver circuitry is provided which includes capacitive circuitry, resistive circuitry, and capacitive transformer circuitry. The capacitive circuitry is coupled in parallel with the antenna to provide capacitive reactance to the coupling circuitry. Resisitive circuitry is coupled in parallel with the antenna and with the capacitive circuitry to provide resistance R in the coupling circuit when an AC voltage at the resonant frequency of the coupling circuit is applied. Capacitive transformer circuitry is coupled in series with the antenna for transforming the resistance value R of the resistive circuitry into a transformed resistance value R'. This increases the apparent resistance of the coupling circuit in parallel with the antenna without increasing the actual resistance and power consumption of the coupling circuit.

10 Claims, 9 Drawing Figures $$\frac{1}{Z_p} = \frac{1}{R_p} + \frac{1}{jX_p} \qquad Z_s = R_s - jX_s$$

$$R_s = \frac{R_p}{1+(R_p/X_p)^2}$$

$$X_s = \frac{X}{1+(X_p/R_p)^2}$$

$$\frac{R_s}{X_s} = \frac{X_p}{R_p}$$

ANTENNA COUPLING CIRCUIT FOR MAGNETIC RESONANCE IMAGING

BACKGROUND OF THE INVENION

1. Field of the Invention

This invention relates generally to the field of magnetic resonance imaging systems and more specifically to an antenna coupling circuit for a coil antenna of a magnetic resonance imaging system.

2. Description of the Related Art

Magnetic resonance imaging ("MRI"), also known as nuclear magnetic resonance ("NMR") imaging, has become a valuable tool as a safe, non-invasive means for obtaining information in the form of images of an object under examination. For example, MRI can be used as a medical diagnostic tool by providing images of the whole or selected portions of the human body without the use of X-ray photography.

MRI systems take advantage of the magnetic properties of spinning nuclei N of chemical species found in the observed object. Each of the nuclei has an internal spin axis and a magnetic pole aligned with the spin axis. The magnetic pole is a vector quantity representing the magnitude and direction of the magnetic field of the nucleus. Application of an external static magnetic field $B_o$ causes the magnetic poles to align themselves along the external magnetic field lines.

The MRI system disturbs this alignment by transmitting an electromagnetic signal to the object. The magnetic field $B_1$ of this transmitted electromagnetic signal is circularly polarized and is perpendicular to the static magnetic field $B_o$. This signal causes the nuclei to precess about the external static magnetic field lines. The frequency of this precession typically is in the radio frequency ("RF") range. More specifically, the precession frequency generally lies within a relatively narrow bandwidth of about 1 to 100 kHz at a center frequency of between 1 and 100 MHz.

As the nuclei precess, they radiate an electromagnetic signal having a circularly polarized rotating magnetic field. The frequency of this rotating magnetic field is generally equal to the precession frequency of the nuclei. The radiated signal is received by the MRI system to produce an image of the object under examination.

MRI systems may employ an inductive coil antenna to transmit and receive the RF signals. The antenna is electrically coupled to a low-noise amplifier of a receiving circuit which senses the voltage from the antenna. A signal processor then processes this voltage signal to produce an image of the object.

These MRI systems usually include antenna coupling circuitry for coupling the antenna coil to the receiving circuit. This coupling circuitry typically includes a parallel resonant circuit coupled to a low-noise receiving amplifier A of the receiving circuit, as shown in FIG. 1. The antenna coil is the inductor L of the resonant circuit. The capacitor C represents the total capacitance of the coupling circuit in parallel with coil L. The resistance R represents the total resistance of the coupling circuit in parallel with coil L. At the resonant frequency $f_o$ of the circuit, the reactance becomes zero and the impedance is equal to the resistance R in parallel with coil L and the input terminals of amplifier A.

The quality of the image that can be produced with such an MRI system is dependent upon the signal-to-noise ratio ("SNR") of the system. In contrast with other imaging methods such as X-ray photography, the RF signal transmitted by the object under examination is essentially free of noise. The vicinity of the MRI system is generally well shielded so that noise attributable to external sources of electromagnetic radiation are minimized or eliminated. There are, however, several sources of noise within the MRI system which may significantly degrade performance. A most important noise source is attributable to thermal noise associated with electrical losses, i.e., dissipation or resistance, in the system.

As is well known, any electrical resistor at a temperature above absolute zero will have a noise power generated within it by the random thermal motion of the charge carriers. The thermal noise power or Johnson noise is equal to kTB where k is Boltzmann's constant, T is the absolute temperature, and B is the system noise bandwidth in Hertz. This noise power is independent of the current flowing through the resistor and is also independent of the resistance value. However, the noise voltage (as opposed to the noise power) is a function of resistance since the voltage V for a given power is a function of resistance R ($P = V^2/R$). Because amplifier A coupled to the antenna coupling circuit is responsive to voltage, the noise voltage attributable to resistances in the system affects the SNR.

There are a number of resistances in the MRI system which contribute to the noise voltage at amplifier A of the receiving circuit, two of which generally predominate. The first resistance is attributable to the electrical conductivity of the object under examination. Since the object is electrically conductive, the presence of this object near coil L creates a resistance $R_o$ in parallel with the coil. The second resistance is attributable to resistances of the individual electrical components comprising the coupling circuit. As is well known, there is a resistance associated with any practical electrical component, including capacitive and inductive elements. This second resistance $R_c$ associated with these components creates a noise voltage at amplifier A even in the absence of a conductive object near the coil.

Other sources of noise may include resistances attributable to external coupling of coil L with external conductors (conductive objects which are not part of and are external to the antenna coil and the coupling and receiving circuits, such as the frame of the MRI system), and coupling of the object under examination with such external conductors. However, these noise sources are not discussed further since they may be controlled or eliminated by appropriate design considerations and are not directly relevant to the present invention. In addition, amplifier A itself has resistances and associated noise within it, which are not relevant here but will be discussed below. Thus, antenna coupling circuits essentially include two resistances, $R_o$ and $R_c$, in parallel with inductor L (the antenna coil). These parallel resistances may equivalently be considered to represent the total resistance R in parallel with inductor L, as shown in FIG. 1.

The sensitivity of the receiving system can be expressed quantitatively in terms of the circuit quality factor or circuit "Q" as follows:

$$Q = 2\pi E_s/E_d \qquad (1)$$

where $E_s$ is the energy stored in the resonant circuit during one cycle of a sinusoidal oscillation and $E_d$ is the energy dissipated during the one cycle of that sinusoidal oscillation. It can be shown that the SNR of the MRI system, assuming resistances $R_o$ and $R_c$ are the only noise sources, is proportional to the square root of the circuit Q:

$$SNR \alpha Q^{0.5} \qquad (2)$$

The circuit Q may also be expressed in terms of the inductive reactance $X_L$ of coil L and resistance R in parallel with coil L as follows:

$$Q = R/X_L \qquad (3)$$

The inductive reactance $X_L$ of the circuit is defined by the following equation:

$$X_L = 2\pi f_o l \qquad (4)$$

where $f_o$ is the resonant frequency of the circuit and l is the inductance of coil L. At the resonant frequency $f_o$, the inductance l of coil L and the capacitance C of the circuit are related by the following mathematical relationship:

$$(2\pi f_o)^2 = 1/(lC) \qquad (5)$$

Thus, as shown in equation 3 above, obtaining a high circuit Q for the parallel resonant circuit of FIG. 1 requires parallel resistance R to be large or inductive reactance $X_L$ to be small, or both. For a given antenna design and therefore a given inductive reactance $X_L$, improvement in system performance may be achieved by making the value of resistance R in parallel with coil L as large as possible given practical constraints placed on the system.

Moreover, an efficient design requires that resistance $R_c$ of the circuit components should be much larger than resistance $R_o$ of coil L from the object under observation. This corresponds to a relatively high value for the circuit Q of the resonant circuit itself, without the presence of an object in the vicinity of coil L. Of course, coil L itself should have low series resistance or, equivalently, high parallel resistance. Thus, a coupling circuit having relatively greater resistance $R_c$ of its components in parallel with coil L is needed.

Practical antenna coupling circuits generally include a number of electrical components in addition to those shown in FIG. 1. For example, the capacitance C of FIG. 1, which represents the total capacitance of the resonant circuit, generally includes a tuning capacitor and one or more direct current ("DC") blocking capacitors. The resistance R in the circuit of FIG. 1, which represents the total resistance of the circuit in parallel with coil L, is equal to the resistance $R_o$ introduced by the presence of the object near coil L and the resistance $R_c$ of the coupling circuit components, since the presence of other losses has been assumed away.

The resistance $R_o$ in parallel with the antenna coil attributable to the presence of the object to be examined is not generally amenable to design variation without interfering with the RF signals used by the MRI system. However, the resistance $R_c$ associated with the coupling circuit components is generally amenable to design variations which increase the value of the total resistance R in parallel with coil L and thereby increase the circuit Q.

It is possible to increase the resistance $R_c$ of the components in parallel with the coil, for example, by increasing the resistance of parallel resistors in the circuit. However, increasing the resistance $R_c$ of the components also has the undesirable effect of increasing the actual resistance in the coupling circuit, which results in increased power consumption and noise voltage.

Accordingly, it is an intent of the invention to provide an antenna coupling circuit which has an enhanced SNR and a correspondingly enhanced circuit Q while avoiding an increase in actual resistance and noise of the circuit.

A further intent of the invention is to provide an antenna coupling circuit with high apparent resistance in parallel with the antenna and low actual resistance in the circuit.

It is still further an intent of the invention to provide an antenna coupling circuit which, in addition to satisfying the intentions set forth above, balances the antenna coil with respect to a ground.

Additional intentions and advantages of the invention will be set forth in the description which follows, and in part will be obvious from the description, or may be learned by practice of the invention. The intentions and advantages of the invention may be realized and obtained by means of the instrumentalities and combinations particularly pointed out in the appended claims.

SUMMARY OF THE INVENTION

To achieve the foregoing intentions, and in accordance with the purposes of the invention as embodied and broadly described herein, a coupling circuit for coupling an inductive coil antenna of an MRI system to receiver circuitry is provided comprising capacitive means coupled in parallel with the antenna for providing capacitive reactance in the coupling circuit, resistive means coupled in parallel with the antenna and with the capacitive means for providing resistance in the coupling circuit when the inductive reactance of the coupling circuit is equal to the capacitive reactance of the coupling circuit, and capacitive transformer means coupled between the antenna and the receiver circuitry and in series with the antenna for transforming the resistive value of the resistive means into a transformed resistive value, thereby increasing the apparent resistance of the coupling circuit in parallel with the antenna.

In a first preferred embodiment, the capacitive transformer means comprises a padder capacitor, the value of which is selected to provide the transformed value of the parallel resistance while retaining the total capacitance of the circuit at the value required for resonance with the inductor (the antenna).

In a second preferred embodiment, the capacitive transformer means comprises a first padder capacitor coupled between the antenna and the receiver circuitry and in series with the antenna on one side of the antenna, and a second padder capacitor coupled between the antenna and the receiver circuitry and in series with the antenna on the other side of the antenna.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention. Of the drawings.

DESCRIPTION OF THE PREFERRED EMBODIMENTS

Figure 1:
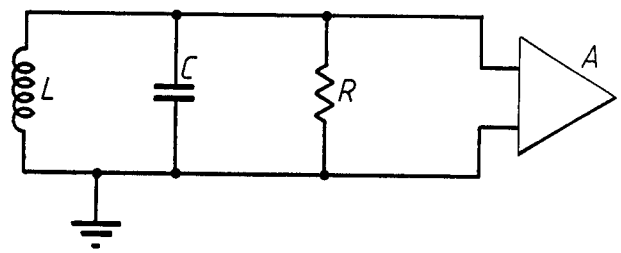
FIG. 1 is a schematic diagram of a parallel resonant circuit known in the prior art.

Reference will now be made in detail to the presently preferred embodiments of the invention as illustrated in the accompanying drawings, wherein like reference characters designate like or corresponding parts throughout the several drawings.

A first preferred embodiment of the antenna coupling circuit of the present invention will now be described with reference to FIG. 2. The antenna coupling circuit of this embodiment is for coupling an inductive coil antenna L of an MRI system to receiver circuitry. The coupling circuit is connected to coil L at a first antenna terminal $T_{L1}$ and a second antenna terminal $T_{L2}$ of the coupling circuit. The output of the coupling circuit is coupled to the input terminals of a low-noise amplifier A at a first output terminal $T_{O1}$ and a second $T_{O2}$ output terminal of the coupling circuit. First antenna terminal $T_{L1}$ is coupled to first output terminal $T_{O1}$ by first coupling means, which preferably comprises a first conductive path P1. Second antenna terminal $T_{L2}$ is coupled to second output terminal $T_{O2}$ by second coupling means, which preferably comprises a second conduction path P2. Each of the first and second conduction paths P1 and P2 preferably comprises a line conductor such as that of an integrated circuit or a printed circuit board. Note that first conduction path P1 includes capacitors C3 and C5 (as explained below) and, thus, need not be conductive for DC nor for all frequencies of an alternating current ("AC") source. This applies equally to second conduction path P2, as will be seen below.

The coupling circuit includes capacitive means coupled at a first end to the first coupling means and at a second end to the second coupling means and, thus, coupled in parallel with coil L. This capacitive means preferably includes capacitors C1, C2, C3, C4 and diode D1. Capacitor C1 is a tuning capacitor. Capacitors C2 and C3 are direct current ("DC") blocking capacitors. Capacitor C2 provides DC blocking for the tuning circuit (diode D1 and external circuitry coupled at terminal T) while capacitor C3 provides DC blocking for the receiving circuit (of which only amplifier A is shown). Since capacitors C2 and C3 are used for blocking purposes, the value of their capacitances is relatively large. Capacitor C4 is a bypass capacitor and typically has a relatively large capacitance, also.

Diode D1 serves as a variable capacitor (varicap diode) and is used for tuning the resonant frequency $f_o$ of the coupling circuit. Diode D1 includes a pn junction diode in parallel with coil L. The cathode of diode D1 is coupled to one end of a biasing resistor R1. The other end of biasing resistor R1 is coupled to a tuning voltage terminal T which provides a DC tuning voltage to the cathode of diode D1 across resistor R1. This tuning voltage provides a reverse bias on diode D1 which influences the size of the depletion region of the pn junction of diode D1, thereby controlling the capacitance of this diode. In addition to these capacitors and diode D1, the capacitive means may include a parasitic capacitance (not shown) associated with each of the electrical components of the circuit.

The antenna coupling circuit of the first preferred embodiment also includes resistive means coupled at one end to the first coupling means and at the other end to the second coupling means, thereby being in parallel with coil L and the capacitive means. This resistive means preferably comprises a biasing resistor R1, which is in parallel with coil L at high frequencies, and a load resistor R2. Protection diodes D2 and D3 are included to arrest current surges which could damage the circuit. Since any practical electrical component has some resistance associated with it, the resistive means also includes the resistances associated with diodes D1, D2, and D3. The resistive means provides the combined resistance R in parallel with coil L, as shown in FIG. 1.

The antenna coupling circuit of the first preferred embodiment also includes capacitive transformer means coupled between coil L and the receiver circuitry in series with coil L for transforming the resistance value R of the resistive means into a transformed resistive value R', thereby increasing the apparent resistance of the coupling circuit in parallel with the antenna coil L. The capacitive transformer means preferably includes a padder capacitor C5 on one side of coil L and in series with coil L with respect to output terminals $T_{O1}$ and $T_{O2}$ at receiving amplifier A. As shown in FIG. 2, padder capacitor C5 is located in conduction path P1 and may be considered part of the first coupling means.

Since coil L is an inductor and is coupled in parallel with the capacitive means and the resistive means, the first preferred embodiment comprises a resonant RLC circuit with resonant frequency $f_o$. Coil L provides inductive reactance $X_L$, and the capacitive means and the capacitive transformer means together provide capacitive reactance $X_C$. The resistive means provides resistance R in the coupling circuit when the inductive reactance $X_L$ of the coupling circuit is equal to the capacitive reactance $X_C$ of the circuit and, thus, the circuit is at its resonant frequency $f_o$ (e.g., in the RF range described above). The capacitive transformer means, e.g., padder capacitor C5, together with the capacitive means in parallel with coil L form a capacitive transformer which transforms the resistance value R of the resistive means to a higher transformed resistance value R'. The higher transformed resistance value R' in parallel with coil L increases the circuit Q as described above without increasing the actual resistance and the power consumption of the coupling circuit.

Figure 3:
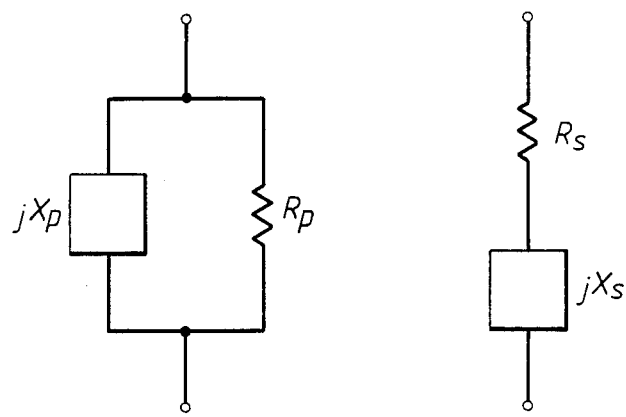
FIG. 3 is a schematic diagram of a parallel circuit having resistive and reactive components and an equivalent series circuit having different resistive and reactive components.

A method for determining the capacitance value for the padder capacitor C5 will now be described with reference to FIGS. 3 and 4. The determination makes use of a well-known lemma for converting a parallel circuit of a reactance ($jX_p$) and a resistance ($R_p$) into an equivalent series circuit with a different reactance ($jX_s$) and a different resistance ($R_s$), and vice versa. FIG. 3 shows the parallel circuit which has resistance $R_p$ and reactance $jX_p$. The equivalent series circuit is shown adjacent the parallel circuit and comprises a different resistance $R_s$ and reactance $jX_s$. Since the circuits are equivalent, the real or resistive components of the respective circuits are equal, as are the reactive components. Therefore, the lemma may be derived by obtaining a mathematical expression for the impedance Z of each circuit. The real component of the parallel circuit is then equated with the real component of the series circuit, and the imaginary or reactive component of the parallel circuit is equated with that of the series circuit. It should be noted that this lemma is applicable only for a single frequency. If frequency is varied, the variations of resistance and impedance as functions of frequency must be incorporated.

The left side of FIG. 3 shows a schematic diagram of a generalized parallel circuit having a real or resistive component with resistance $R_p$ in parallel with an imaginary or reactive component having reactance $jX_p$. The impedance $Z_p$ of this parallel circuit is shown below it to have the form:

$$\frac{1}{Z_p} = \frac{1}{R_p} + \frac{1}{jX_p} \tag{6}$$

where j is the imaginary operator. The reactance $jX_p$ is generalized and may be either capacitive or inductive. The right side of FIG. 3 shows an equivalent series circuit having a different real component with resistance $R_s$ and a different imaginary component with reactance $jX_s$. The impedance $Z_s$ of this series circuit has the form:

$$Z_s = R_s + jX_s \tag{7}$$

as shown below the series circuit in FIG. 3.

The impedance $Z_p$ of the parallel circuit can be put in a more convenient but mathematically equivalent form as follows. Taking the reciprocal of both sides of equation 6 gives:

$$Z_p = \frac{1}{1/R_p - j/X_p} \tag{8}$$

which, when the numerator and the denominator of the right side are multiplied by the complex conjugate of the denominator $(1/R_p + j/X_p)$, becomes:

$$Z_p = \frac{1/R_p + j/X_p}{(1/R_p)^2 + (1/X_p)^2} \tag{9}$$

where $R_p$ and $X_p$ are real numbers. Thus, the real component of the parallel circuit is:

$$\frac{1/R_p}{(1/R_p)^2 + (1/X_p)^2} \tag{10}$$

and the imaginary component is:

$$\frac{1/X_p}{(1/R_p)^2 + (1/X_p)^2} \tag{11}$$

Equating the real component $R_s$ of the series circuit with the real component (equation 10) of the parallel circuit gives:

$$R_s = \frac{1/R_p}{(1/R_p)^2 + (1/X_p)^2} \tag{12}$$

which, when the right side is multiplied by $(R_p^2/R_p^2)$, becomes:

$$R_s = \frac{R_p}{1 + (R_p/X_p)^2} \tag{13}$$

Equating the imaginary component of the series circuit with that of the parallel circuit gives:

$$X_s = \frac{1/X_p}{(1/R_s)^2 + (1/X_p)^2} \tag{14}$$

which, when the right side is multiplied by $(X_p^2/X_p^2)$, becomes:

$$X_s = \frac{X_p}{1 + (X_p/R_p)^2} \tag{15}$$

Taking the ratio of the real to the imaginary component of each of the equivalent circuits using equations 12 and 14, it can be seen that:

$$\frac{R_s}{X_s} = \frac{X_p}{R_p} \tag{16}$$

as shown in FIG. 3.

Figure 2:
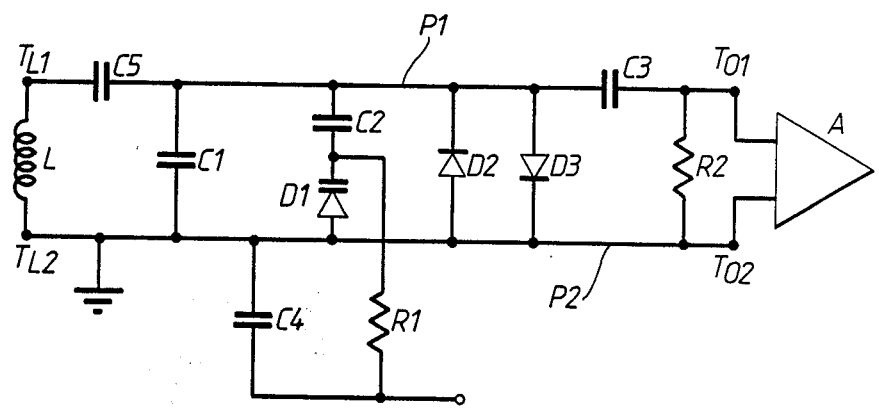
FIG. 2 is a schematic diagram of a first preferred embodiment of the antenna coupling circuit of the present invention.
Figure 4A:
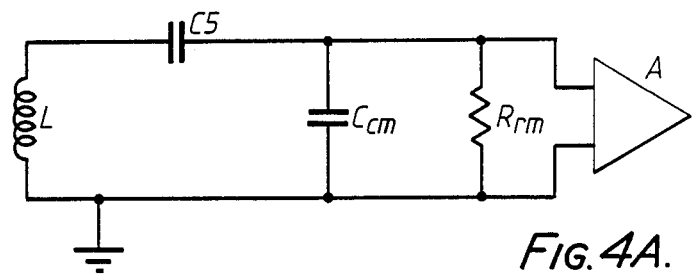
FIGS. 4A through 4D are equivalent circuits to the circuit of FIG. 2.

Use of the lemma to determine the capacitance value of the padder capacitor C5 is facilitated by converting the coupling circuit shown in FIG. 2 to an equivalent circuit as shown in FIG. 4A. The capacitor $C_{cmp}$ in parallel with coil L represents the capacitance of the capacitive means. In the example of the first preferred embodiment, capacitance $C_{cmp}$ is obtained by combining the capacitances of capacitor C1 and varicap diode D1. Blocking capacitors C2 and C3 and tuning capacitor C4 have relatively large capacitances and, thus, are disregarded at high frequencies.

Resistor $R_{rmp}$ represents the parallel resistance of the resistive means and, in the example of the first preferred embodiment, includes the resistances of biasing resistor R1, load resistor R2, and the other components of the circuit contributing to the resistance in parallel with coil L. Padder capacitor C5 is retained as it appears in FIG. 2.

Figure 4B:
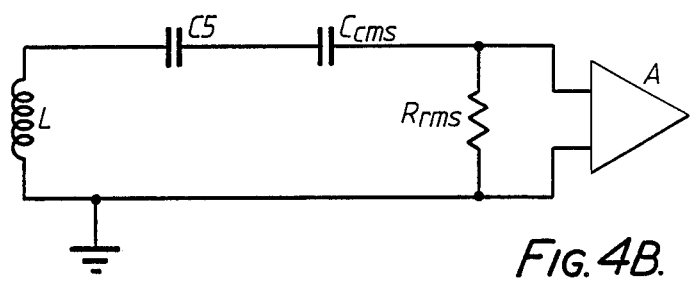

It can be seen from the equivalent circuit of FIG. 4A that capacitance $C_{cmp}$ is in parallel with the resistance $R_{rmp}$. The lemma is used to convert this parallel circuit (containing $C_{cmp}$ and $R_{rmp}$) to its equivalent series circuit. Thus, parallel capacitance $C_{cmp}$ is converted to its equivalent series capacitance $C_{cms}$, and parallel resistance $R_{rmp}$ is converted to its equivalent series resistance $R_{rms}$, as shown in FIG. 4B. Since a parallel resistance is being converted to its equivalent series resistance, series resistance $R_{rms}$ is significantly lower than parallel resistance $R_{rmp}$.

Figure 4C:
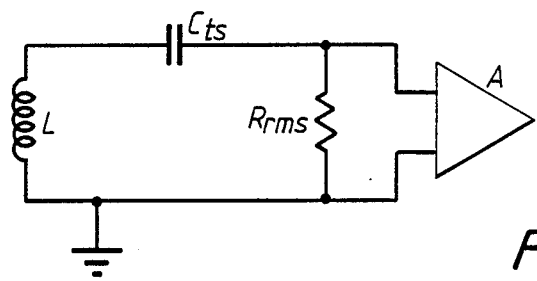
Figure 4D:
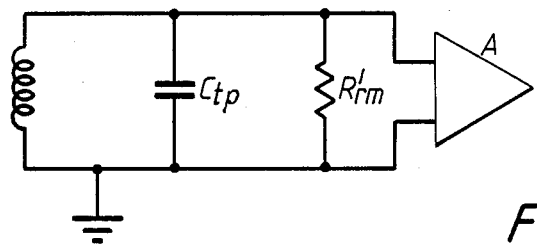

The capacitance of padder capacitor C5 may be determined at this point by selecting the value which, when combined with the other capacitances in the coupling circuit (here the series capacitance $C_{cms}$), results in the circuit having the total capacitance C in parallel with coil L required for resonance at the desired resonant frequency $f_o$. The capacitances of padder capacitor C5 and series capacitance $C_{cms}$ may then be combined to form a single equivalent series capacitance $C_{ts}$, as shown in FIG. 4C.

The transformed value $R'_{rmp}$ of resistance in parallel with coil L is obtained by again using the lemma to convert the equivalent series capacitance $C_{ts}$ and the series resistance $R_{rms}$ into an equivalent parallel capacitance $C_{tp}$ and an equivalent parallel resistance $R'_{rmp}$. This equivalent parallel circuit resistance $R'_{rmp}$ is a transformed resistive value $R'_{rm}$ and has an apparent resistance which is significantly higher than the untransformed value $R_{rmp}$. The impedance transformation ratio ($R'_{rmp}/R_{rmp}$) is constrained in practice, however, since an excessive transformation will reduce the amplifier input voltage so that the internal noise of amplifier A may become important.

An advantage of the antenna coupling circuit of the first preferred embodiment is that it provides large apparent resistance in parallel with coil L while avoiding an increase in actual resistance and actual power consumption of the coupling circuit, as desired. However, a problem which may persist in the first preferred embodiment is that the voltages on the respective ends of coil L, at antenna terminals $T_{L1}$ and $T_{L2}$, are unbalanced with respect to ground. A balanced coil requires that these voltages be equal in magnitude and opposite in sign, i.e. 180° out of phase. A balanced coil is desirable because it reduces capacitive coupling between coil L and the other electrical components around coil L, and it may reduce the effect of electric fields from external interference sources.

The second preferred embodiment overcomes this potential problem by providing first and second capacitance transformer means in place of the first embodiment capacitive transformer means or, equivalently, by splitting the capacitive transformer means of the first preferred embodiment into a plurality of padder capacitors, to increase the apparent resistance in parallel with coil L while balancing coil L.

Figure 5:
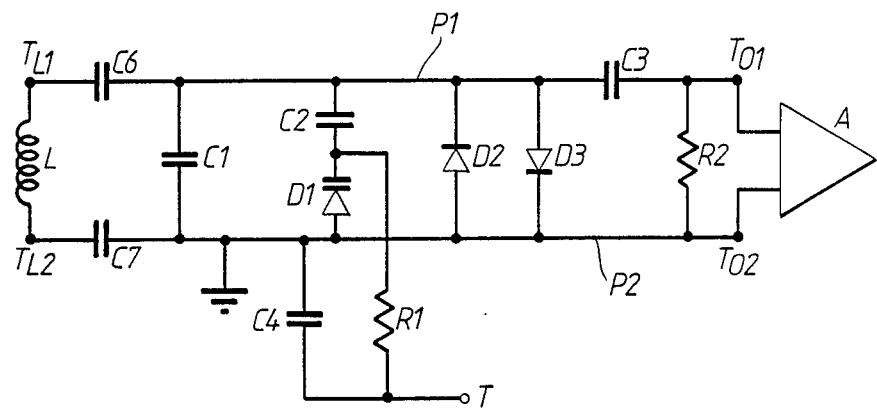
FIG. 5 is a schematic diagram of a second preferred embodiment of the antenna coupling circuit of the present invention.

The second preferred embodiment of the antenna coupling circuit of the present invention will now be described with reference to FIG. 5. As in the first preferred embodiment, the second preferred embodiment includes first coupling means, second coupling means, capacitive means, and resistive means, all configured as described above with respect to the first preferred embodiment.

The second preferred embodiment differs from the first preferred embodiment in that the capacitive transformer means comprises a first capacitive transformer means, e.g., a first padder capacitor C6, coupled between coil L and the receiver circuitry in series with coil L on one side of coil L, e.g., at first antenna terminal $T_{L1}$, and a second capacitive transformer means, e.g., padder capacitor C7, coupled between coil L and the receiver circuitry in series with coil L on the other side of coil L, e.g., at second antenna terminal $T_{L2}$. First padder capacitor C6 is preferably positioned along first conduction path P1. Therefore, the first coupling means may be considered to include the first capacitive transformer means. Likewise, second padder capacitor C7 is preferably positioned along second conduction path P2 and, thus, the second coupling means may be considered to include the second capacitive transformer means.

The first and second transformer means together transform the apparent resistance R of the resistive means into a transformed resistance value R', thereby increasing the apparent resistance of the coupling circuit in parallel with coil L, as described above with respect to the first preferred embodiment. More specifically, the result of the first preferred embodiment, i.e. increased apparent parallel resistance, may be obtained with the second preferred embodiment by replacing padder capacitor C5 with an equivalent series combination of capacitors, e.g., padder capacitors C6 and C7. The individual capacitances of capacitors C6 and C7 may then be selected to balance coil L with respect to ground.

Accordingly, one method for selecting the respective capacitances of padder capacitors C6 and C7 is to simultaneously solve a first equation mathematically expressing a first condition—the equality of padder capacitor C5 with the combination of padder capacitors C6 and C7—and a second equation stating a second condition—the balancing of coil L with respect to ground. In the description of this method, the symbol for each of the capacitors and for varicap diode D1 described above will be used both to designate the electrical component itself and the capacitance value associated with the respective component.

The first step of this method is to obtain a capacitance value for padder capacitor C5 of the first preferred embodiment as though that embodiment were to be used. This value is then equated with the capacitance of the series combination of capacitors C6 and C7 to obtain the first equation having the following form:

$$C5 = \frac{(C6)(C7)}{C6 + C7} \qquad (17)$$

where C5 is a known, fixed value.

The second equation, which expresses the balancing condition, may be obtained by equating the combined or equivalent capacitance of components between first antenna terminal $T_{L1}$ and ground with the combined or equivalent capacitance of components between second antenna terminal $T_{L2}$ and ground.

Figure 6:
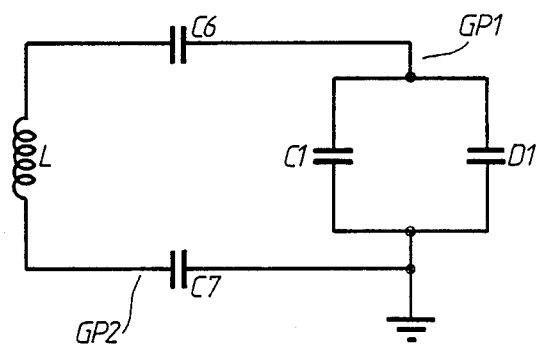
FIG. 6 is an equivalent circuit to the circuit of FIG. 5.

The components of the coupling circuit of FIG. 2 which exhibit capacitance at high frequencies are shown in FIG. 6. A first path GP1 from first antenna terminal $T_{L1}$ to ground includes padder capacitor C6 in series and capacitor C1 and varicap diode D1 in parallel. The equivalent series capacitance $C_S$ of the parallel capacitances is the sum of the individual capacitances (C1+D1). The equivalent series capacitance $C_{GP1}$ of padder capacitor C6 and the equivalent series capacitance $C_S$, i.e. the combined capacitance of first path GP1, has the form:

$$C_{GP1} = \frac{(C1 + D1)(C6)}{C1 + D1 + C6} \qquad (18)$$

where capacitances C1 and D1 are known, fixed quantities.

A second path GP2 from second antenna terminal $T_{L2}$ to ground includes only padder capacitor C7 in series with coil L. Thus, the capacitance $C_{GP2}$ of second path GP2 has the form:

$$C_{GP2} = C7 \qquad (19)$$

Since it is required that the capacitance $C_{GP1}$ of path GP1 be equal to the capacitance $C_{GP2}$ of path GP2 for the balanced coil condition ($C_{GP1} = C_{GP2}$), the following expression for the second equation is obtained by equating the right hand-sides of equations 18 and 19:

$$C_7 = \frac{(C1 + D1)(C6)}{C1 + D1 + C6} \quad (20)$$

Equation 20 is simultaneously solved with equation 17 to obtain capacitance values C6 and C7 for padder capacitors C6 and C7, respectively.

Additional advantages and modifications will readily occur to those skilled in the art. For example, the capacitive transformer means may comprise a plurality of padder capacitors rather than the examples of one and two padder capacitors described above. Therefore, the invention in its broader aspects is not limited to the specific details, representative circuits, and illustrative examples shown and described. Accordingly, departures may be made from such details without departing from the spirit or scope of the general inventive concept as defined by the appended claims and their equivalents.

What is claimed is:

1. A coupling circuit for coupling an inductive coil antenna of a magnetic resonance imaging system to receiver circuitry, said coupling circuit comprising:
   capacitive means, coupled in parallel with said antenna, for providing capacitive reactance in said coupling circuit;
   resistive means, coupled in parallel with said antenna and with said capacitive means, for providing resistance R in said coupling circuit when the inductive reactance of said coupling circuit is equal to the capacitive reactance of said coupling circuit; and
   capacitive transformer means, coupled between said antenna and said receiver circuitry in series with said antenna, for transforming said resistance value R of said resistive means into a transformed resistance value R', thereby increasing the apparent resistance of said coupling circuit in parallel with said antenna.

2. A coupling circuit as recited in claim 1, wherein the capacitive transformer means comprises a padder capacitor.

3. A coupling circuit as recited in claim 1, wherein the capacitive transformer means comprises first capacitive transformer means, coupled between the antenna and the receiver circuitry in series with the antenna on one side of said antenna, and second capacitive transformer means, coupled between said antenna and said receiver circuitry and in series with said antenna on the other side of said antenna.

4. A coupling circuit as recited in claim 3, wherein the first capacitive transformer means comprises a first padder capacitor.

5. A coupling circuit as recited in claim 3, wherein said second capacitive transformer means comprises a second padder capacitor.

6. A coupling circuit for coupling an inductive coil antenna of a magnetic resonance imaging system to receiver circuitry, said coupling circuit comprising:
   first means for coupling a first terminal of said antenna to a first terminal of said receiver circuitry;
   second means for coupling a second terminal of said antenna to a second terminal of said receiver circuitry;
   capacitive means, coupled at a first end to said first coupling means and at a second end to said second coupling means and thereby being coupled in parallel with said antenna, for providing capacitive reactance in said coupling circuit;
   resistive means, coupled at one end to said first coupling means and at the other end to said second coupling means and thereby being in parallel with said antenna and said capacitive means, for providing resistance R in said coupling circuit when the inductive reactance of said coupling circuit is equal to the capacitive reactance of said coupling circuit; and
   capacitive transformer means, coupled in series with said antenna in said first coupling means, for transforming said resistance value R of said resistive means into a transformed resistance value R', thereby increasing the apparent resistance of said coupling circuit in parallel with said antenna.

7. A coupling circuit as recited in claim 6, wherein the capacitive transformer means comprises a padder capacitor.

8. A coupling circuit for coupling an inductive coil antenna of a magnetic resonance imaging system to receiver circuitry, said coupling circuit comprising:
   first means for coupling a first terminal of said antenna to a first terminal of said receiver circuitry;
   second means for coupling a second terminal of said antenna to a second terminal of said receiver circuitry;
   capacitive means, coupled at a first end to said first coupling means and at a second end to said second coupling means and thereby being coupled in parallel with said antenna, for providing capacitive reactance in said coupling circuit; and
   resistive means coupled at one end to said first coupling means and at the other end to said second coupling means, thereby being in parallel with said antenna and said capacitive means, for providing resistance R in said coupling circuit when the inductive reactance of said coupling circuit is equal to the capacitive reactance of said coupling circuit;
   first capacitive transformer means coupled in series with said antenna in said first coupling means; and
   second capacitive transformer means, coupled in series with said antenna in said second coupling means;
   said first and said second transformer means together transforming the resistance value R of said resistive means into a transformed resistance value R', thereby increasing the apparent resistance of said coupling circuit in parallel with said antenna.

9. A coupling circuit as recited in claim 8, wherein the first capacitive transformer means comprises a first padder capacitor.

10. A coupling circuit as recited in claim 8, wherein the second capacitive transformer means comprises a second padder capacitor.

* * * * *